United States Patent
Kulavik

(10) Patent No.: US 9,478,997 B1
(45) Date of Patent: Oct. 25, 2016

(54) ELECTRONIC DEVICE CHARGING VIA AN AUDIO JACK

(71) Applicant: Voyetra Turtle Beach, Inc., Valhalla, NY (US)

(72) Inventor: Richard Kulavik, San Jose, CA (US)

(73) Assignee: Voyetra Turtle Beach, Inc., Valhalla, NY (US)

( * ) Notice: Subject to any disclaimer, the term of this patent is extended or adjusted under 35 U.S.C. 154(b) by 189 days.

(21) Appl. No.: 14/445,510

(22) Filed: Jul. 29, 2014

Related U.S. Application Data

(60) Provisional application No. 61/894,657, filed on Oct. 23, 2013.

(51) Int. Cl.
| | |
|---|---|
| *G06F 17/00* | (2006.01) |
| *H02J 7/00* | (2006.01) |
| *H04R 3/00* | (2006.01) |
| *H03G 3/20* | (2006.01) |

(52) U.S. Cl.
CPC ............... *H02J 7/0042* (2013.01); *H03G 3/20* (2013.01); *H04R 3/00* (2013.01); *H04R 2420/09* (2013.01)

(58) Field of Classification Search
CPC ......... H02J 7/0042; H03G 3/20; H04R 3/00; H04R 2420/09; H04B 5/0037
See application file for complete search history.

(56) References Cited

U.S. PATENT DOCUMENTS

| | | | | |
|---|---|---|---|---|
| 2012/0321097 A1* | 12/2012 | Braho | ...................... | H04R 1/10 381/74 |
| 2013/0083927 A1* | 4/2013 | Savant | ................. | H04R 1/1025 381/2 |

* cited by examiner

*Primary Examiner* — Fan Tsang
*Assistant Examiner* — David Siegel
(74) *Attorney, Agent, or Firm* — McAndrews, Held & Malloy

(57) ABSTRACT

An electronic device may comprise audio processing circuitry and a first connector having a first contact and a second contact. In a first mode of operation, the audio processing circuitry is configured to output one or more audio signals carrying music and/or voice via the first contact and the second contact. In a second mode of operation, the audio processing circuitry is configured to output a signal for delivering supply current via the first contact and the second contact. While the electronic device is in the first mode of operation, a gain and/or volume limit of the audio processing circuitry may be set to a first level, and while the electronic device is in the second mode of operation, the gain and/or volume limit of the audio processing circuitry may be set to a second level that is higher than the first level.

14 Claims, 9 Drawing Sheets

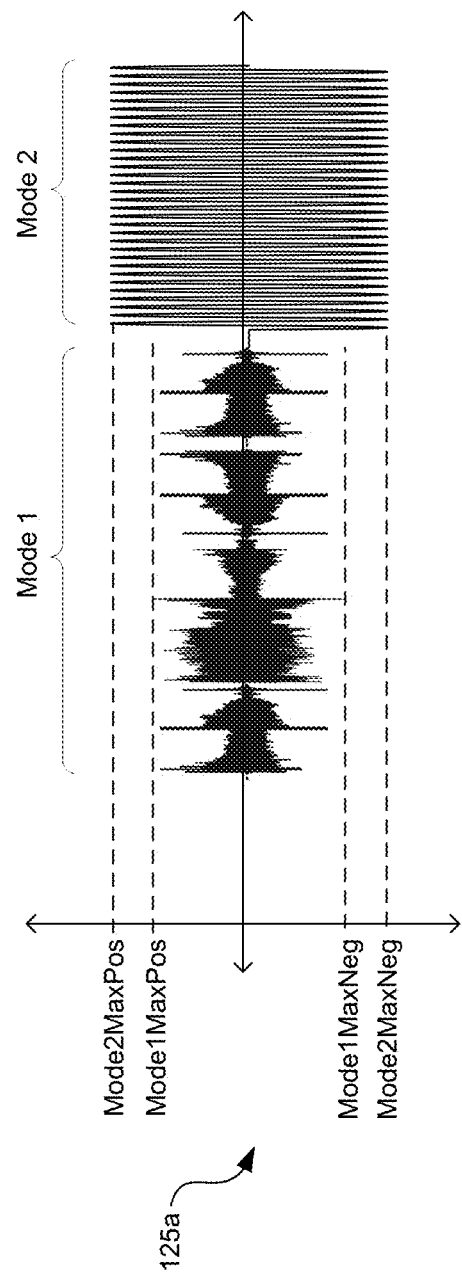

ELECTRONIC DEVICE CHARGING VIA AN AUDIO JACK

PRIORITY CLAIM

This application claims the benefit of priority of U.S. provisional patent application 61/894,657 titled "Electronic Device Charging via an Audio Jack" filed on Oct. 23, 2013.

TECHNICAL FIELD

Aspects of the present application relate to electronic gaming. More specifically, to methods and systems for electronic device charging via an audio jack.

BACKGROUND

Limitations and disadvantages of conventional approaches to electronic device charging will become apparent to one of skill in the art, through comparison of such approaches with some aspects of the present method and system set forth in the remainder of this disclosure with reference to the drawings.

BRIEF SUMMARY

Methods and systems are provided for electronic device charging via an audio jack, substantially as illustrated by and/or described in connection with at least one of the figures, as set forth more completely in the claims.

BRIEF DESCRIPTION OF THE DRAWINGS

FIG. 6 depicts an example voltage or current waveform.

DETAILED DESCRIPTION

As utilized herein the terms "circuits" and "circuitry" refer to physical electronic components (i.e. hardware) and any software and/or firmware ("code") which may configure the hardware, be executed by the hardware, and or otherwise be associated with the hardware. As used herein, for example, a particular processor and memory may comprise a first "circuit" when executing a first one or more lines of code and comprise a second "circuit" when executing a second one or more lines of code. As utilized herein, "and/or" means any one or more of the items in the list joined by "and/or". As an example, "x and/or y" means any element of the three-element set {(x), (y), (x, y)}. As another example, "x, y, and/or z" means any element of the seven-element set {(x), (y), (z), (x, y), (x, z), (y, z), (x, y, z)}. As utilized herein, the terms "e.g.," and "for example" set off lists of one or more non-limiting examples, instances, or illustrations. As utilized herein, circuitry is "operable" to perform a function whenever the circuitry comprises the necessary hardware and code (if any is necessary) to perform the function, regardless of whether performance of the function is disabled, or not enabled, by some user-configurable setting.

Figure 1:
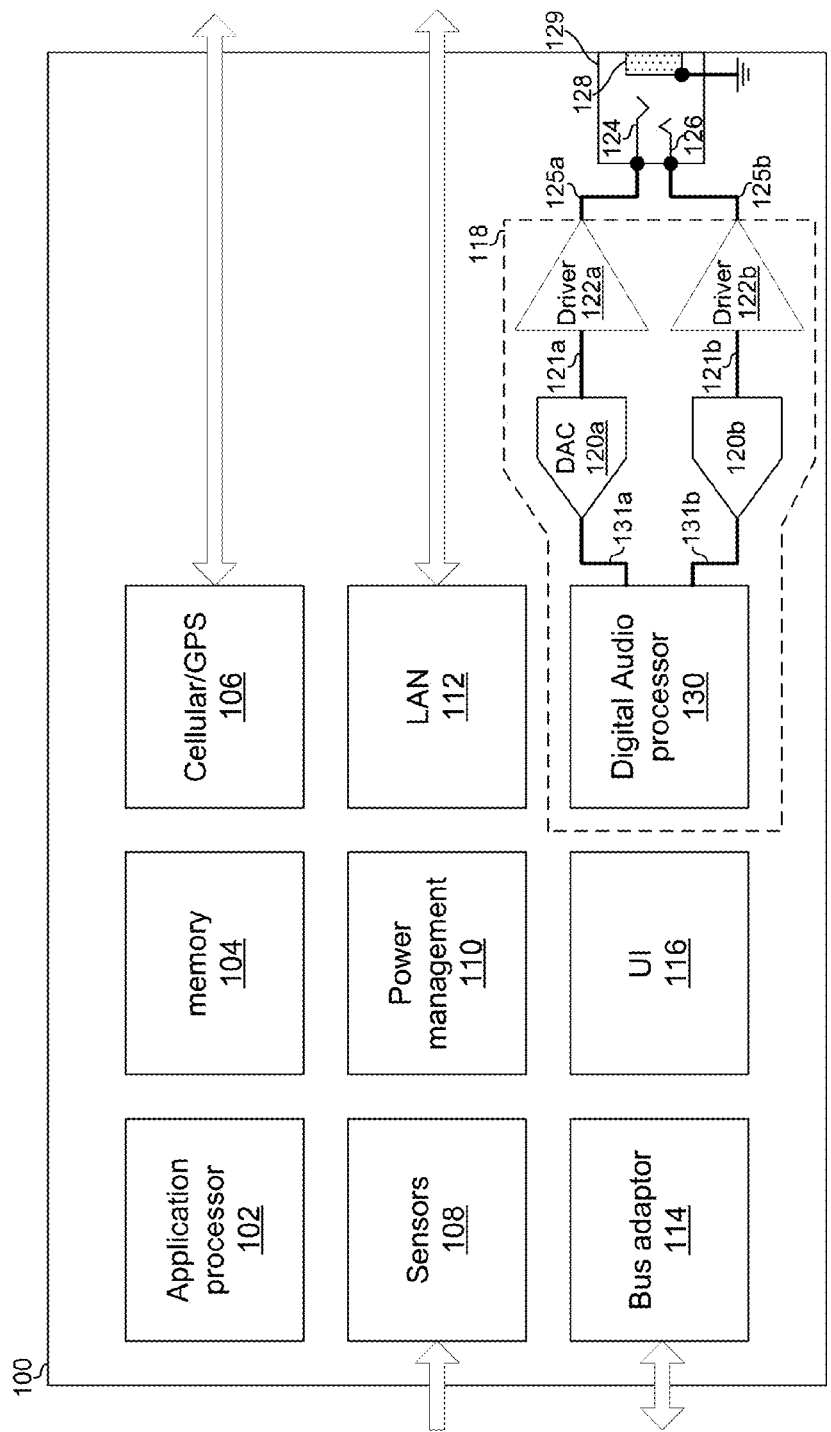
FIG. 1 depicts a block diagram of a device that is operable to output supply current via the same contacts that it uses to output audio signals.

FIG. 1 depicts a block diagram of a device that is operable to output supply current via the same pins that it uses to output audio signals. The example electronic device 100 comprises an application processor 102, memory subsystem 104, a cellular/GPS networking subsystem 106, sensors 108, power management subsystem 110, LAN subsystem 112, bus adaptor 114, user interface subsystem 116, and audio processing circuitry 118.

The application processor 102 comprises circuitry operable to execute instructions for controlling/coordinating the overall operation of the device 100 as well as graphics processing functions of the multi-purpose device 100. Such instructions may be part of an operating system of the device 100 and/or part of one or more software applications running on the device 100.

The memory subsystem 104 comprises volatile memory for storing runtime data, nonvolatile memory for mass storage and long-term storage, and/or a memory controller which controls reads writes to memory.

The cellular/GPS networking subsystem 106 comprises circuitry operable to perform baseband processing and analog/RF processing for transmission and reception of cellular and GPS signals.

The sensors 108 comprise, for example, a camera, a gyroscope, an accelerometer, a biometric sensor, and/or the like.

The power management subsystem 110 comprises circuitry operable to manage distribution of power among the various components of the multi-purpose device 100.

The LAN subsystem 112 comprises circuitry operable to perform baseband processing and analog/RF processing for transmission and reception of wired, optical, and/or wireless signals (e.g., Wi-Fi, Wi-Fi Direct, Bluetooth, Ethernet, and/or the like).

The bus adaptor 114 comprises circuitry for interfacing one or more internal data busses of the device 100 with an external bus (e.g., a Universal Serial Bus) for transferring data to/from the device 100 via a wired connection.

The user interface subsystem 116 comprises circuitry operable to control and relay signals to/from a touchscreen, hard buttons, and/or other input devices of the device 100.

The connector 129 comprises contacts 124, 126, and 128. In the example implementation depicted, the connector is a tip-ring-sleeve (TRS) phone socket. When a TRS phone plug is mated with the connector 129, the contact 126 makes conductive contact with the tip of the plug, the contact 124 makes conductive contact with the ring of the plug, and the sleeve 128 makes contact with the sleeve of the plug. In other example implementations, the connector 129 may be a phone plug rather than a phone socket. In other example implementations, the connector 129 may be a tip-sleeve (TS) or tip-ring-ring-sleeve (TRRS) phone connector. In other example implementations, the connector 129 may a form factor other than a phone connector (e.g., USB, Ethernet, HDMI, and/or the like).

The audio processing circuitry 118 comprises digital audio processor 130, digital-to-analog converters (DACs) 120a and 120b, and amplifiers/line drivers 122a and 122b. The digital audio processor 130 comprises circuitry operable to process digital audio signals (e.g., .wav files, .mp3 files, and/or the like). The processing performed by the digital audio processor 130 may comprise, for example, compression, decompression, encryption, decryption, resampling, equalization, etc. The digital audio processor 130 outputs signals 131*a* and 131*b*. Each of the DACs 120*a* and 120*b* comprises circuitry operable to convert a respective one of signals 131*a* and 131*b* to a respective one of analog signals 121*a* and 121*b*. Each of the amps 122*a* and 122*b* comprises circuitry operable to amplify a voltage and/or current of the signals 121*a* and 121*b* to generate a respective one of signals 125*a* and 125*b* suitable for driving a load (e.g., cabling and input circuitry a peripheral device) connected to the connector 129.

In a first mode of operation, one (for mono) or both (for stereo) of the signals 131*a* and 131*b* may be an audio signal (e.g., carrying music and/or voice) (e.g., signal 131*a* may carry left channel audio and signal 131*b* may carry right channel audio). In the first mode, the DACs 120*a* and 120*b* and amps 122*a* and 122*b* may generate signals compatible with speakers (e.g., headphones) that are intended to be paired with the device 100. The compatibility may be ensured by, for example, controlling a gain and/or amplitude limit of the amps 122*a* and 122*b* and/or DACs 120*a* and 120*b* such that characteristics (e.g., peak current, peak voltage, peak power, RMS current, RMS voltage, RMS power, and/or the like) of the signals 125*a* and 125*b* are maintained within limits tolerated by the speakers.

In a second mode of operation, one or both of the signals 131*a* and 131*b* may be a signal (e.g., a sine wave) for conveying supply current to a peripheral device connected to connector 129. In the second mode, the DACs 120*a* and 120*b* and amps 122*a* and 122*b* may generate signals that may be incompatible with speakers (e.g., headphones) with which the device 100 is intended to be paired. The incompatibility may be the result of a gain and/or amplitude limit of the amps 122*a* and 122*b* and/or DACs 120*a* and 120*b* being higher than tolerated by the speakers. The higher gain and/or amplitude limit may increase the rate and/or efficiency of supply current delivery. This increase may result in signal characteristics (e.g., peak current, peak voltage, peak power, RMS current, RMS voltage, RMS power, and/or the like) that could damage the speakers. In an example implementation, frequency content of the signal for conveying supply current may be outside the audio band (e.g., it may be a sine wave of frequency higher than 20 KHz).

An example voltage or current waveform of signal 125*a* during both Mode 1 and Mode 2 is shown in FIG. 6. While in mode 1, the signal 125*a* is limited between Mode1MaxPos and Mode1MaxNeg. While in mode 2, the signal 125*a* is limited between Mode2MaxPos (corresponding to a larger signal amplitude than Mode1MaxPos) and Mode2MaxNeg (corresponding to a larger signal amplitude than Mode1MaxNeg).

Figure 2A:
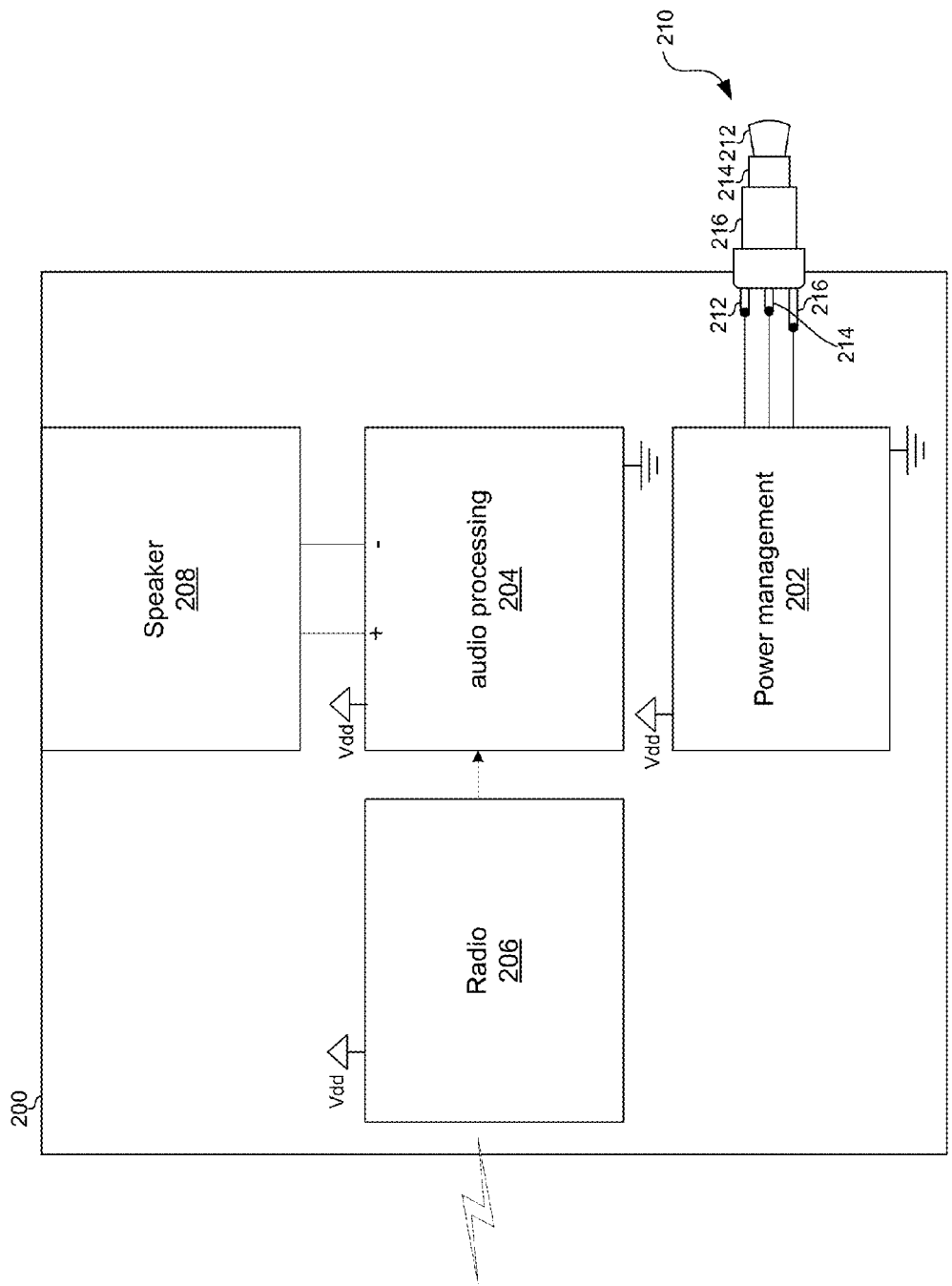
FIGS. 2A-2D depict block diagrams of example peripheral devices configured for receiving supply current via an audio jack of a host device.

Now referring to FIG. 2A, there is shown a first example peripheral device 200 comprising power management circuitry 202, audio processing circuitry 204, radio 206, speaker 208, and connector 210. The peripheral device 200 of FIG. 2A may be, for example, a Bluetooth earpiece.

The connector 210 comprises contacts 212, 214, and 216. In the example implementation depicted, the connector is a tip-ring-sleeve (TRS) phone plug, where the contact 212 is the tip, contact 214 is the ring, and contact 216 is the sleeve. When a TRS phone plug is mated with the connector 129 of the device 100 (FIG. 1), the contact 126 makes conductive contact with the tip 212, the contact 124 makes conductive contact with the ring 214, and the sleeve 128 makes contact with the sleeve 216. In other example implementations, the connector 210 may be a phone plug rather than a phone socket. In other example implementations, the connector 210 may be a tip-sleeve (TS) or tip-ring-ring-sleeve (TRRS) phone connector. In other example implementations, the connector 210 may have a form factor other than a phone connector (e.g., USB, Ethernet, HDMI, and/or the like).

The power management circuitry 202 is operable to rectify, regulate, and/or otherwise condition current received via the connector for using the current to charge a battery of the device 200 and/or provide supply current to the radio 206, and the audio processing circuitry 204. The supply current is depicted as being delivered via a single power rail labeled as "Vdd". In other example implementations, multiple power rails at multiple voltages may be generated for delivering the supply current.

The audio processing circuitry 204 is operable to perform digital and analog processing of audio signals received via the radio 206 and output the audio signals to the speaker 208.

The radio 206 comprises circuitry operable to communicate wirelessly with another device (e.g., with LAN circuitry 112 of device 100) to receive digital audio signals which it may output to the audio processing circuitry 204. The wireless communications may be in accordance with, for example, Wi-Fi, Wi-Fi Direct, Bluetooth, and/or another standard.

The speaker 208 is operable to convert electrical signals received from audio processing circuitry 204 into acoustic waves.

Figure 2B:
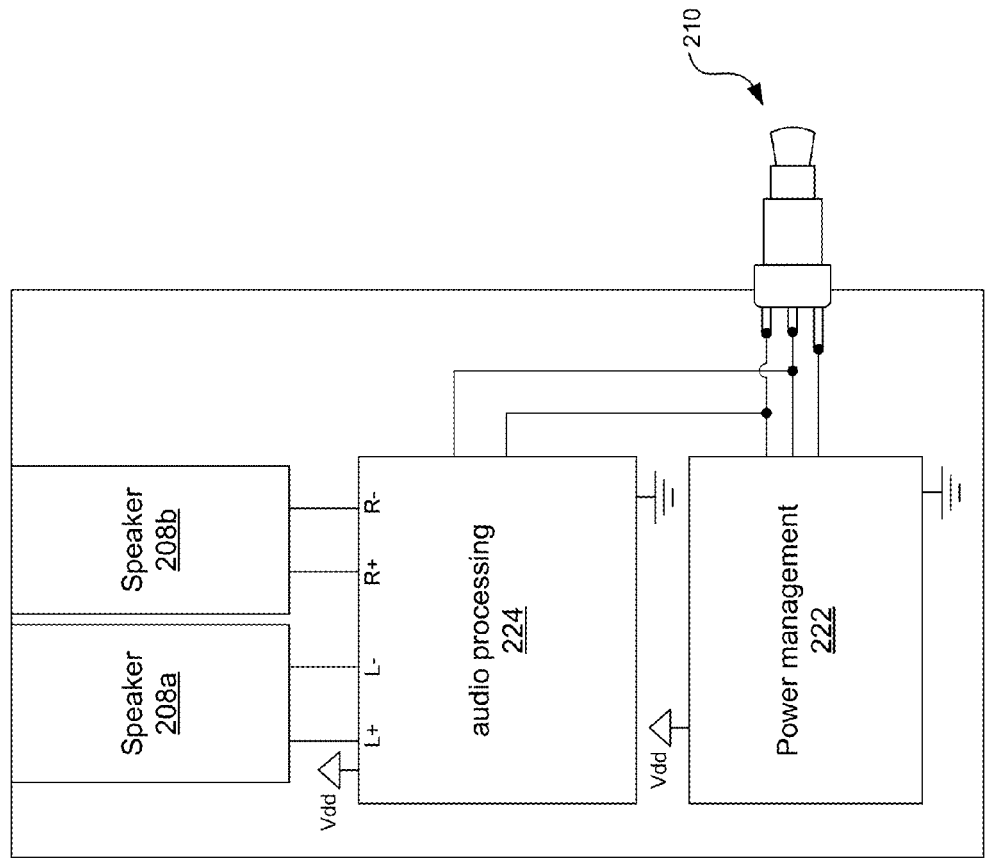

Now referring to FIG. 2B there is shown a second example peripheral device 200 comprising power management circuitry 222, audio processing circuitry 224, and speakers 208*a* and 208*b*.

Each of the speakers 208*a* and 208*b* is operable to convert electrical signals received from audio processing circuitry 204 into acoustic waves. In an example implementation, left channel audio may be delivered to speaker 208*a* and right channel audio may be delivered to speaker 208*b*.

The power management circuitry 222 is operable to rectify, regulate, and/or otherwise condition current received via the connector for using the current to charge a battery of the device 200 and/or provide supply current to the audio processing circuitry 224. The supply current is depicted as being delivered via a single power rail labeled as "Vdd". In other example implementations, multiple power rails at multiple voltages may be generated for delivering the supply current.

In an example implementation, the power management circuitry 222 may also be operable to detect, for each of the signals received via connector 210, whether the signal is a signal for delivering supply current or is an audio signal (e.g., carrying music and/or voice), and to configure itself/operate accordingly. In such an example implementation, if a signal is an audio signal, the power management circuitry 222 may disable a portion of its circuitry that harvests power from the signal. If neither of the signals is a signal for delivering supply current, the power management circuitry 222 may configure itself to rely on battery power. Conversely, in such an implementation, if a signal is a signal for delivering supply current, the power management circuitry 222 may enable a portion of its circuitry that harvests power from the signal and may use that power to supply the audio processing circuitry 224 and/or charge its battery.

The audio processing circuitry 224 is operable to perform digital and analog processing of audio signals received via the connector 210 and output the audio signals to the speaker 208.

In an example implementation, the audio processing circuitry 224 may also be operable to detect, for each signal received via connector 210, whether the signal is a signal for delivering supply current or is an audio signal (e.g., carrying audio and/or voice), and to configure itself/operate accordingly. In such an example implementation, if the signal is a signal for delivering supply current, the audio processing circuitry 224 may disable a portion of its circuitry that receives the signal and processes it for output to one or both of the speakers 208a and 208b. Conversely, in such an example implementation, if the signal is an audio signal, the audio processing circuitry 224 may enable a portion of its circuitry that receives the audio signal and processes it for output to one or both of the speakers 208a and 208b. Where neither of the signals received via connector 210 is an audio signal, the audio processing circuitry 224 may go into a power saving mode until an audio signal is detected.

Figure 2C:
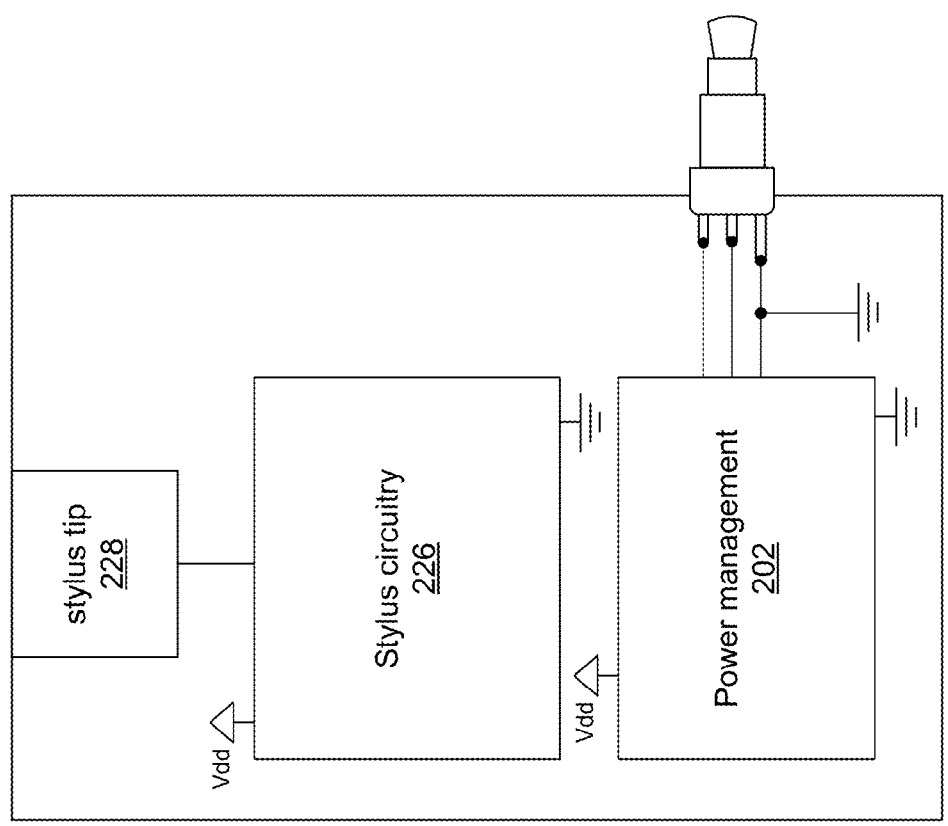

Now referring to FIG. 2C, as a third example peripheral device 200, there is shown a stylus for use with a touchscreen of electronic device 100. The stylus comprises power management circuitry 202, stylus circuitry 226, and tip 228. The power management circuitry 202 may be as described above, for example, and may provide supply current to the stylus circuitry 226. The stylus circuitry 226 may operate to, for example, increase a capacitance between a user of the stylus and the touchscreen such that the screen can be interacted with when the tip is only near, and not necessarily touching, the touchscreen.

Figure 2D:
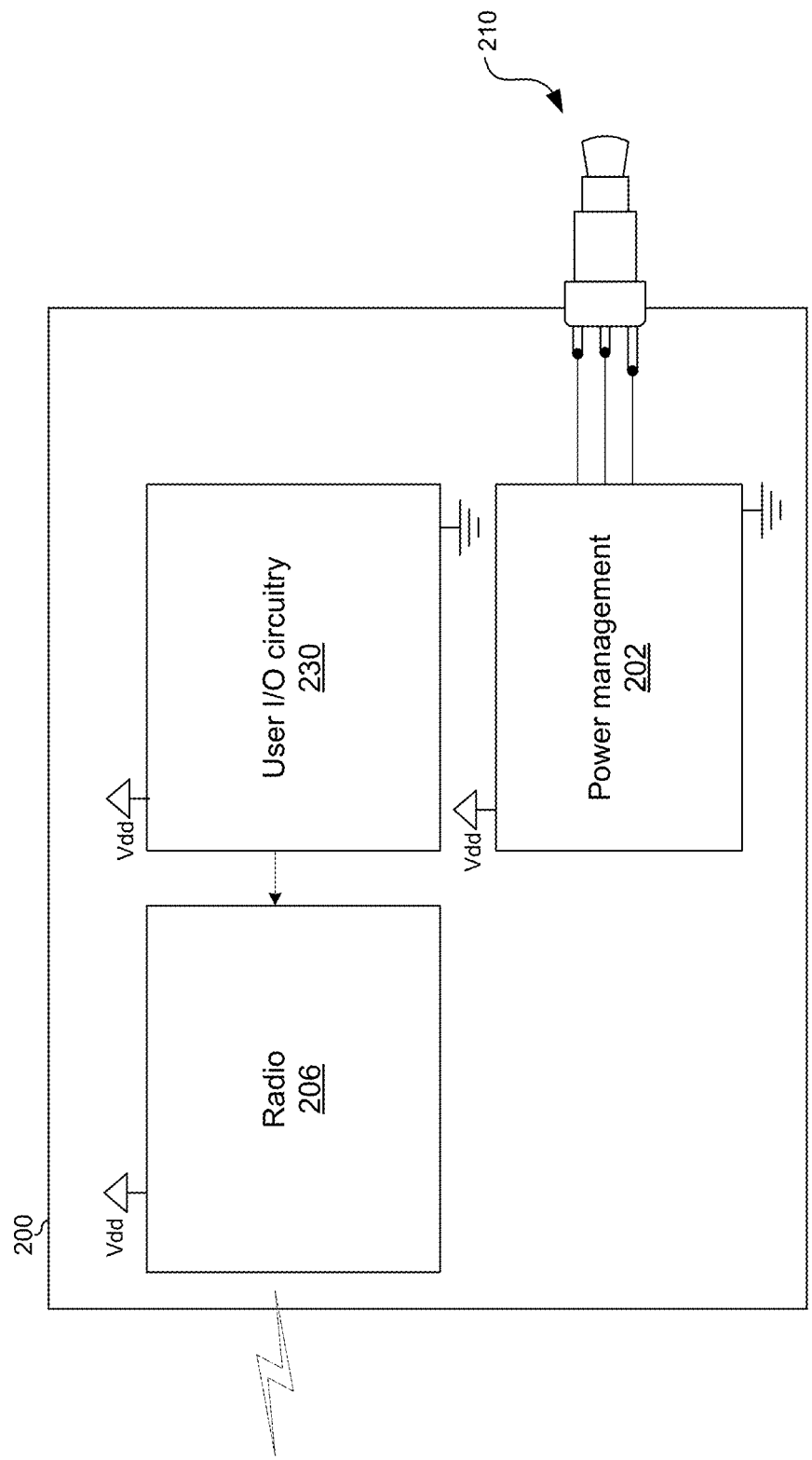

Now referring to FIG. 2D, as a fourth example peripheral device 200, there is shown an input/output device (e.g., mouse, keyboard, or the like) for use with electronic device 100. The device 200 of FIG. 2D comprises power management circuitry 202, I/O circuitry 230, and radio 206. The radio 206 may be as described above, for example. The power management circuitry 202 may be as described above and may provide supply current to the circuitry 230 and radio 206. The user I/O circuitry 230 may comprise, for example, circuitry to generate signals in response to user interaction with the device 200 (e.g., circuitry to generate signals in response to presses of keys of the device 200, in response to movement of the device 200, etc.). The signals may be conveyed to the radio 206 which may relay them to the device 100.

Figure 3C:
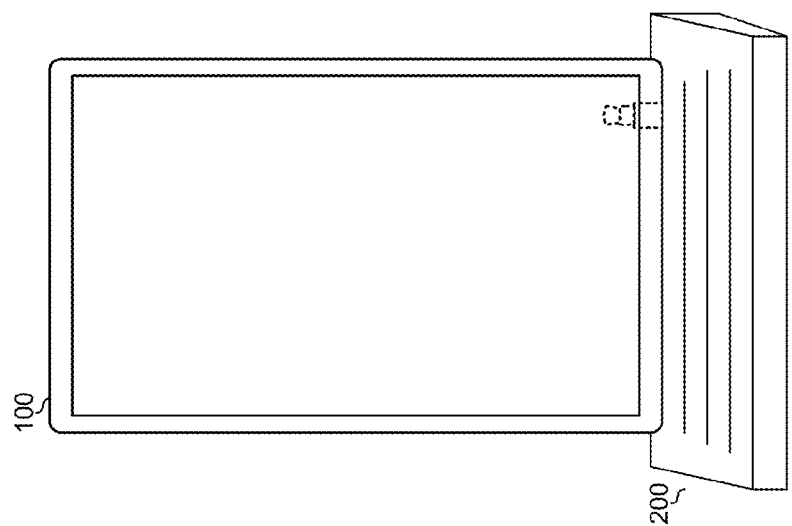
FIG. 3A-3C depict example peripheral devices being powered and/or charged via an audio jack of a host device.
Figure 3B:
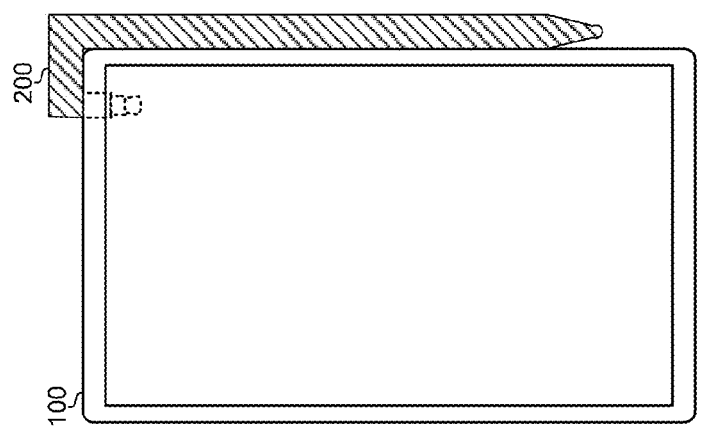
Figure 3A:
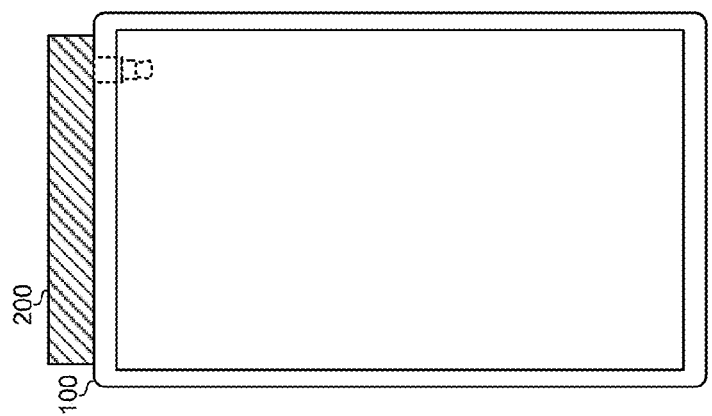

FIGS. 3A-3C depict example peripheral devices being powered and/or charged via an audio jack of a host device. In FIG. 3A, the device 200 (e.g., Bluetooth earpiece) rests on the top of the device 100 while its connector 210 is mated with the connector 129 of the device 100. In FIG. 3A, the device 200 (e.g., stylus) rests alongside the device 100 while its connector 210 is mated with the connector 129 of the device 100. In FIG. 3C, the device 200 (e.g., a keyboard) rests beneath and/or in front of the device 100 while its connector 210 is mated with the connector 129 of the device 100 (e.g., the device 200 may also serve as a stand for the device 200 while the two are mated). In the example implementations of FIGS. 3A-3C, a case (either the primary case or an after-market case) of the device 100 may provide a cavity or other mechanism for securely retaining the device 200 to the device 100 while the two are mated via connectors 210 and 129.

Figure 4:
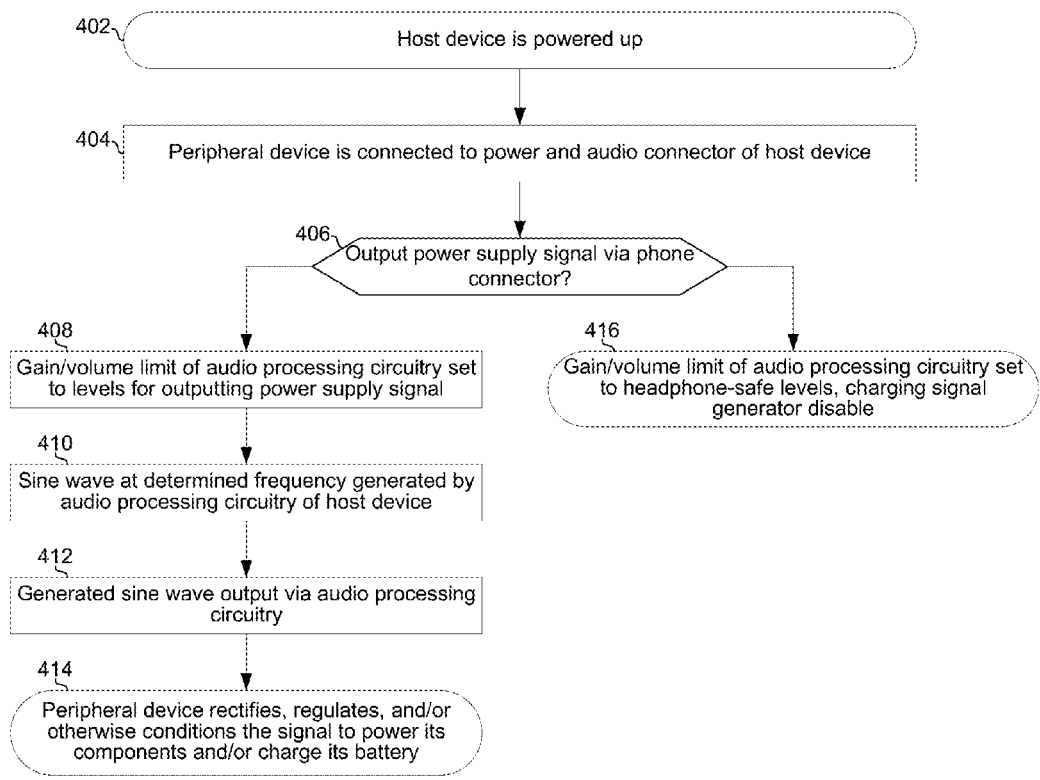
FIG. 4 is a flowchart illustrating an example process for powering and/or charging a peripheral device via an audio jack of a host device.

FIG. 4 is a flowchart illustrating an example process for powering and/or charging a peripheral device via an audio jack of a host device. The process begins with block 402 in which host device 100 is powered up. In block 404, a peripheral device 200 is connected to device 100 via the connector 129. In block 406, the device 100 determines whether to output a power supply signal via the connector 129.

In an example implementation, the determination of block 406 may be based on user input. For example, upon detecting a peripheral device has been connected to the device 100, the device 100 may present a graphical user interface element that, when interacted with by a user, enables output of a power supply signal via the connector 129. Because such a signal may damage headphones or other devices which may also use the connector 129, the device 100 may present a query such as shown by possible answers Yes 502 and No 504 in FIG. 5A.

In an example implementation, the determination of block 406 may be based on an automatic detection of whether the peripheral device connected to the connector 129 is configured for receiving supply power via the connector 129. Such an automatic detection may comprise, for example, the device 100 starting with a power supply signal that is safe for headphones (or other devices that may use the connector 129) and monitoring the current drawn via the connector 129 to determine whether the connected peripheral device can receive supply power via connector 129. For example, if the current exceeds an amount expected for peripheral devices that do support power via connector 129, the device 100 may determine that the attached device is not such a device. As another example, current draw profiles of known peripheral devices may be stored locally and/or on a network and the device 100 may use a measured current draw profile for the connected device 200 to identify the connected device 200 and, thus, determine whether the connected device 200 can receive supply power via the connector 129. Upon detecting that the connected device 200 supports charging, a query such as shown by possible answers Yes 502 and No 504 in FIG. 5B may be presented to confirm that the user desires to enable output of the power supply signal via connector 129.

Still in block 406, if it is determined not to begin outputting a power supply signal via the connector 129, then the process advances to block 416.

In block 416, the device 100 is configured into a first mode of operation in which circuitry of the device 100 is configured for outputting audio signals. This configuration may comprise, for example, setting a gain and/or volume limit of the audio processing circuitry 118, and disabling circuitry for generating power supply signals for output via connector 129 (e.g., disabling an oscillator that is dedicated to generating power supply signals).

Returning to block 406, if it is determined to begin outputting a power supply signal via connector 129, the process advances to block 408 in which circuitry of the device 100 is configured for outputting a power supply signal. This configuration may comprise, for example, setting a gain and/or amplitude limit of the DACs 120 and/or amplifiers 122, and/or enabling circuitry dedicated for outputting a power supply signal.

In block 410, the digital audio processor 130 generates a digital version of the power supply signal. In an example implementation, a PLL or digital frequency synthesizer may be enabled to generate a digital sine wave output as signal 131a, as signal 131b, or as the different between signals 131a and 131b. In another example implementation, a sine wave stored as a .wav file may be read from memory and played on a loop by the digital audio processor 130 resulting in a digitized sine wave output as signal 131a, as signal 131b, or as the different between signals 131a and 131b. The frequency of the sine wave may be a frequency that is selected based on the particular peripheral device that is to be charged/powered since different frequencies may result in different power delivery efficiency for different peripheral devices.

In block 412, the digital sine wave is converted to analog and amplified for output via the connector 129.

In block 414, the peripheral device receives the signal and rectifies, regulates, and/or otherwise conditions it to generate a clean DC power rail for delivering power to circuitry of the peripheral device 200 and/or for charging a battery of the peripheral device 200.

Figure 5B:
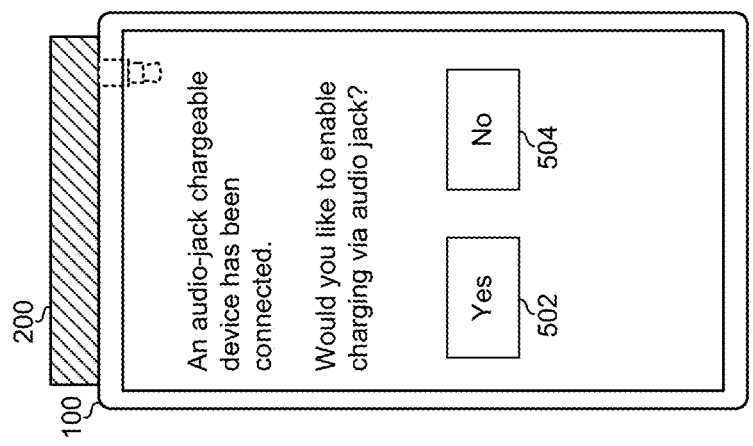
FIGS. 5A and 5B depict example graphical user interfaces of a host device operable to output supply current via the same contacts on which it outputs audio signals.
Figure 5A:
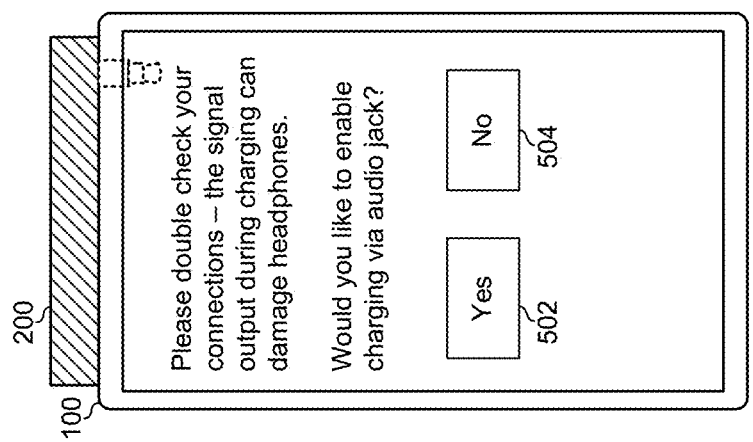

In accordance with an example implementation of this disclosure, an electronic device (e.g., 100) comprising audio processing circuitry (e.g., 118) and comprising a first connector (e.g., 129) having a first contact (e.g., a first one of 124, 126, and 129) and a second contact (e.g., a second one of 124, 126, and 129). In a first mode of operation, the audio processing circuitry is configured to output one or more audio signals carrying music and/or voice via the first contact and the second contact. In a second mode of operation, the audio processing circuitry is configured to output a signal for delivering supply current via the first contact and the second contact. While the electronic device is in the first mode of operation, a gain and/or volume limit of the audio processing circuitry may be set to a first level, and while the electronic device is in the second mode of operation, the gain and/or volume limit of the audio processing circuitry may be set to a second level that is higher than the first level. The first level may be a level determined to be compatible (e.g., levels and/or frequency will not damage the headphones and/or levels and/or frequency are suitable for listening by a person wearing the headphones) for headphones and the second level may be a level determined to be unsafe (e.g., levels and/or frequency could damage the headphones and/or levels and/or frequency are unsuitable for listening by a person wearing the headphones) for headphones. The signal for delivering the supply current may be a sine wave having a frequency higher than 20 kHz. The electronic device may comprise circuitry operable to sense whether a peripheral device connected to the first contact and the second contact is capable of receiving supply current via the first contact and the second contact. The circuitry operable to sense may be operable to monitor an amount of current output by the audio processing circuitry as an amplitude of the signal for delivering supply current is ramped up, and determine whether to transition to the first mode of operation based on the monitored amount of current output by the audio processing circuitry. The electronic device may comprise a display and circuitry operable to generate a graphical user interface (e.g., as shown in FIGS. 5A and 5B) querying a user of the electronic device as to whether to configure the electronic device into the first mode of operation. The first connector may be a tip-sleeve (TS), tip-ring-sleeve (TRS), or tip-ring-ring-sleeve (TRRS) phone socket. The peripheral device may comprise a battery, a speaker (e.g., 208), and a second connector (e.g., 210) configured to mate with the first connector. When the first device is operating in the first mode, the peripheral device may be configured to charge its battery using the supply current received via the first contact and the second contact. When the first device is operating in the second mode, the peripheral device may be configured to receive the audio signals via the first contact and the second contact and output the audio signals via the speaker. The second connector may be a tip-sleeve (TS), tip-ring-sleeve (TRS), or tip-ring-ring-sleeve (TRRS) phone plug.

The present method and/or system may be realized in hardware, software, or a combination of hardware and software. The present methods and/or systems may be realized in a centralized fashion in at least one computing system, or in a distributed fashion where different elements are spread across several interconnected computing systems. Any kind of computing system or other apparatus adapted for carrying out the methods described herein is suited. A typical combination of hardware and software may be a general-purpose computing system with a program or other code that, when being loaded and executed, controls the computing system such that it carries out the methods described herein. Another typical implementation may comprise an application specific integrated circuit or chip. Some implementations may comprise a non-transitory machine-readable (e.g., computer readable) medium (e.g., FLASH drive, optical disk, magnetic storage disk, or the like) having stored thereon one or more lines of code executable by a machine, thereby causing the machine to perform processes as described herein.

While the present method and/or system has been described with reference to certain implementations, it will be understood by those skilled in the art that various changes may be made and equivalents may be substituted without departing from the scope of the present method and/or system. In addition, many modifications may be made to adapt a particular situation or material to the teachings of the present disclosure without departing from its scope. Therefore, it is intended that the present method and/or system not be limited to the particular implementations disclosed, but that the present method and/or system will include all implementations falling within the scope of the appended claims.

What is claimed is:

1. A system comprising:
an electronic device comprising audio processing circuitry and comprising a first connector having a first contact and a second contact, wherein:
   in a first mode of operation, said audio processing circuitry is configured to output one or more audio signals carrying music and/or voice via said first contact and said second contact; and
   in a second mode of operation, said audio processing circuitry is configured to output a signal for delivering supply current via said first contact and said second contact;
said electronic device comprises circuitry operable to:
   sense whether a device connected to said first contact and said second contact is capable of receiving supply current via said first contact and said second contact;
   monitor an amount of current output by said audio processing circuitry as an amplitude of said signal for delivering supply current is ramped up; and
   determine whether to transition to said first mode of operation based on said amount of current output by said audio processing circuitry.

2. The system of claim 1, wherein:
while said electronic device is in said first mode of operation, a gain and/or volume limit of said audio processing circuitry is set to a first level; and
while said electronic device is in said second mode of operation, said gain and/or volume limit of said audio processing circuitry is set to a second level that is higher than said first level.

3. The system of claim 2, wherein said first level is determined compatible with headphones and said second level is determined incompatible with headphones.

4. The system of claim 1, wherein said signal for delivering said supply current is a sine wave having a frequency higher than 20 kHz.

5. The system of claim 1, wherein said electronic device comprises a display and circuitry operable to generate a graphical user interface querying a user of said electronic device as to whether to configure said electronic device into said first mode of operation.

6. The system of claim 1, wherein said first connector is a tip-sleeve (TS), tip-ring-sleeve (TRS), or tip-ring-ring-sleeve (TRRS) phone socket.

7. The system of claim 1 comprising a peripheral device that has a battery, a speaker, and a second connector configured to mate with said first connector, wherein the peripheral device is configured to:
when said electronic device is operating in said second mode, charge said battery using said supply current received via said first contact and said second contact; and
when said electronic device is operating in said first mode, receive said audio signals via said first contact and said second contact and output said audio signals via said speaker.

8. The system of claim 7, wherein said second connector is a tip-sleeve (TS), tip-ring-sleeve (TRS), or tip-ring-ring-sleeve (TRRS) phone plug.

9. A method comprising:
performing by circuitry of an electronic device that comprises a first connector having a first contact and a second contact:
while said circuitry is in a first mode of operation, outputting one or more audio signals carrying music and/or voice are via said first contact and said second contact; and
while said circuitry in a second mode of operation, outputting a signal for delivering supply current via said first contact and said second contact;
sensing whether a device connected to said first contact and said second contact is capable of receiving supply current via said first contact and said second contact;
monitoring an amount of current output by said circuitry as an amplitude of said signal for delivering supply current is ramped up; and
determining whether to transition to said first mode of operation based on said amount of current output by said circuitry.

10. The method of claim 9, wherein:
while said circuitry is in said first mode of operation, setting a gain and/or volume limit of said circuitry is to a first level; and
while said circuitry is in said second mode of operation, setting said gain and/or volume limit of said circuitry to a second level that is higher than said first level.

11. The method of claim 10, wherein said first level is determined compatible with headphones and said second level is determined incompatible with headphones.

12. The method of claim 9, wherein said signal for delivering said supply current is a sine wave having a frequency higher than 20 kHz.

13. The method of claim 9, wherein said electronic device comprises a display and said circuitry is operable to generate a graphical user interface on said display that queries a user of said electronic device as to whether to transition to said first mode of operation.

14. The method of claim 9, wherein said first connector is a tip-sleeve (TS), tip-ring-sleeve (TRS), or tip-ring-ring-sleeve (TRRS) phone socket.

* * * * *